US006664999B2

(12) United States Patent
Ohba et al.

(10) Patent No.: US 6,664,999 B2
(45) Date of Patent: Dec. 16, 2003

(54) IMAGE-RECORDING DEVICE AND METHOD

(75) Inventors: Masahiro Ohba, Kanagawa (JP); Ichirou Miyagawa, Kanagawa (JP); Fumiaki Miyamaru, Osaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/308,998

(22) Filed: Dec. 4, 2002

(65) Prior Publication Data

US 2003/0122919 A1 Jul. 3, 2003

(30) Foreign Application Priority Data

Dec. 6, 2001 (JP) ....................................... 2001-372342

(51) Int. Cl.[7] ............................. G03F 7/20; G03F 9/02; G02B 26/10; B41J 2/435

(52) U.S. Cl. ....................... 347/242; 347/245; 347/263; 347/257; 347/258

(58) Field of Search ................................. 347/224, 225, 347/233, 241, 242, 245, 263, 256, 257

(56) References Cited

U.S. PATENT DOCUMENTS 5,134,511 A * 7/1992 Shiraishi et al. ............ 359/196
6,559,880 B2 * 5/2003 Ohba ......................... 347/263

FOREIGN PATENT DOCUMENTS

JP 2001-265005 9/2001

* cited by examiner

*Primary Examiner*—Huan Tran
(74) *Attorney, Agent, or Firm*—Taiyo, Nakatima & Kato

(57) ABSTRACT

At an exposure section, a recording head carries out exposure processing by irradiating a light beam from a fiber array light source through a collimator lens and a condensing lens to a printing plate. A temperature sensor of the recording head measures temperature of the recording head. A pulse motor is driven on the basis of the measured temperature, and thus a separation between the collimator lens and the condensing lens is adjusted. Consequently, regardless of expansion or contraction of the recording head due to temperature changes, the separation between the collimator lens and the condensing lens can be kept constant by the pulse motor. Therefore, even when the light beam incident on the condensing lens is divergent, a shift in magnification of the recorded image can be prevented regardless of the temperature variations of the recording head.

11 Claims, 5 Drawing Sheets

IMAGE-RECORDING DEVICE AND METHOD

BACKGROUND OF THE INVENTION

1. Field of the Invention

The present invention relates to an image-recording device which records an image on a printing plate and method.

2. Description of the Related Art

Devices which record (expose) an image on an image-forming layer (photosensitive layer), which is on a support of a sheet-form printing plate (for example, a "photopolymer plate"), with a direct light beam (a laser beam) have been developed as printing plate exposure devices (image-recording devices).

In a case in which the printing plate exposure device is, for example, a so-called CTP (computer-to-plate) printing plate exposure device, the light beam is irradiated at the printing plate from a collimator lens of a recording head (exposure head), through a condensing lens. In this case, if there is a variation of temperature at the recording head, a separation (distance) between the collimator lens and the condensing lens is changed due to thermal expansion of the recording head. Conventionally, in order to keep the magnification of a recorded image at a certain magnification, the light beam incident on the condensing lens from the collimator lens can be made to be parallel. With such a structure, even if the separation between the collimator lens and the condensing lens is altered, the magnification of the recorded image does not change undesirably.

However, in cases such as when an image resolution is switched in order to change image specification or the like, it is necessary to switch the magnification of the recorded image. To do this, it is necessary for the light beam incident on the condensing lens from the collimator lens to diverge. As a result, if the separation between the collimator lens and the condensing lens changes because of a change in temperature of the recording head, there is a problematic change in the magnification of the recorded image.

Moreover, when the temperature of the recording head changes, the recording head expands or contracts, and a separation between the recording head and the printing plate changes. Accordingly, a separation between the condensing lens and the printing plate changes. Consequently, there is a problem in that a shift of focus of the recorded image occurs.

In addition, when the temperature of the recording head changes, the collimator lens and the condensing lens expand or contract in accordance with changes of temperature of the collimator lens and the condensing lens. As a result, undesired alterations in an amount of divergence of the light beam by the collimator lens and a focusing distance of the light beam from the condensing lens are caused. Consequently, the problems of a change in the magnification and a shift of focus of the recorded image occur in combination.

SUMMARY OF THE INVENTION

In consideration of the circumstances described above, an object of the present invention is to provide an image-recording device and method which can prevent a shift in magnification of a recorded image regardless of temperature variations of a recording head, even when a light beam which is incident on a condensing lens is divergent, and an image-recording device and method which can prevent a shift of focus of a recorded image regardless of temperature variations of a recording head.

An image-recording device according to a first aspect of the present invention is an image-recording device that includes: a recording head which includes a transmission component which transmits a light beam, and a condensing lens at which the light beam transmitted from the transmission component is incident, the recording head recording an image at a printing plate by irradiating the light beam through the transmission component and the condensing lens to the printing plate; a measuring component which measures one of a temperature of the recording head or a temperature of a location which is presumed to be associated with the temperature of the recording head; and an adjustment component which adjusts a separation between the transmission component and the condensing lens on the basis of the temperature measured by the measuring component.

According to the image-recording device of the first aspect, an image is recorded on a printing plate by irradiating a light beam at the printing plate through the transmission component and the condensing lens of the recording head.

The measuring component measures the temperature of the recording head and/or the temperature of the location which is presumed to be associated with the temperature of the recording head. On the basis of the measured temperature, the adjustment component adjusts the separation between the transmission component and the condensing lens. As a result, the separation between the transmission component and the condensing lens can be kept constant by the adjustment component, regardless of contraction or expansion of the recording head due to temperature variations of the recording head. In addition, even if the temperature of the transmission component changes due to temperature variations of the recording head, such that the transmission component expands or contracts and thus an amount of divergence of the light beam from the transmission component is altered, the adjustment component can adjust the separation between the transmission component and the condensing lens, such that this alteration of the amount of divergence of the light beam incident on the condensing lens from the transmission component can be eliminated.

Accordingly, even when the light beam incident on the condensing lens from the transmission component is divergent, a shift in the magnification of the recorded image can be prevented regardless of temperature variations of the recording head (without controlling the temperature of the recording head (the transmission component)).

An image-recording device according to a second aspect of the present invention is an image-recording device that includes: a recording head which includes a condensing lens, the recording head recording an image at a printing plate by irradiating a light beam from the condensing lens to the printing plate; a measuring component which measures one of a temperature of the recording head or a temperature of a location which is presumed to be associated with the temperature of the recording head; and a focus adjustment component which adjusts a separation between the condensing lens and the printing plate on the basis of the temperature measured by the measuring component.

According to the image-recording device of the second aspect, an image is recorded on a printing plate by irradiating a light beam at the printing plate from the condensing lens of the recording head.

In this aspect, the measuring component measures the temperature of the recording head and/or the temperature of the location which is presumed to be associated with the temperature of the recording head. On the basis of the measured temperature, the focus adjustment component adjusts the separation between the condensing lens and the printing plate. As a result, even if, when the recording head expands or contracts due to temperature variations of the recording head, such that the separation between the recording head and the printing plate changes and hence the separation between the condensing lens and the printing plate changes, the separation between the condensing lens and the printing plate can be kept constant by the focus adjustment component. In addition, even if the temperature of the condensing lens changes due to temperature variations of the recording head, such that the condensing lens expands or contracts and thus a focusing distance of the light beam from the condensing lens is altered, the focus adjustment component can adjust the separation between the condensing lens and the printing plate, such that this alteration (shift) of the focusing distance of the light beam from the condensing lens can be eliminated.

Accordingly, even when the temperature of the recording head changes, a loss (shift) of focus of the recorded image can be prevented, without controlling the temperature of the recording head (the condensing lens).

A third aspect of the present invention is an image-recording method comprising the steps of: measuring one of a temperature of a recording head which includes a transmission component which transmits a light beam, and a condensing lens at which the light beam transmitted from the transmission component is incident, the recording head recording an image at a printing plate by irradiating the light beam through the transmission component and the condensing lens to the printing plate, or a temperature a location in the vicinity of the recording head; and adjusting at least one of a separation between the transmission component and the condensing lens and a separation between the condensing lens and the printing pate on the basis of the measured temperature.

A fourth aspect of the present invention is an image-recording device according to the first aspect further comprising: a storing section for storing data relating to relationship between the one of the temperature of the recording head or the temperature of the location which is presumed to be associated with the temperature of the recording head, and the separation between the transmission component and the condensing lens, wherein the adjustment component adjusts the separation between the transmission component and the condensing lens on the basis of the temperature measured by the measuring component and the stored data.

A fifth aspect of the present invention is an image-recording device according to the first aspect further comprising: a storing section for storing data relating to relationship among the one of the temperature of the recording head or the temperature of the location which is presumed to be associated with the temperature of the recording head, the separation between the transmission component and the condensing lens, and an amount of divergence of the light beam from the transmission component, wherein the adjustment component adjusts the separation between the transmission component and the condensing lens on the basis of the temperature measured by the measuring component and the stored data.

A sixth aspect of the present invention is an image-recording device according to the second aspect further comprising: a storing section for storing data relating to relationship between the one of the temperature of the recording head or the temperature of the location which is presumed to be associated with the temperature of the recording head, and the separation between the printing plate and the condensing lens, wherein the focus adjustment component adjusts the separation between the printing plate and the condensing lens on the basis of the temperature measured by the measuring component and the stored data.

A seventh aspect of the present invention is an image-recording device according to the second aspect further comprising: a storing section for storing data relating to relationship among the one of the temperature of the recording head or the temperature of the location which is presumed to be associated with the temperature of the recording head, the separation between the printing plate and the condensing lens, and a focus distance of the light beam from the condensing lens, wherein the focus adjustment component adjusts the separation between the printing plate and the condensing lens on the basis of the temperature measured by the measuring component and the stored data.

An eighth aspect of the present invention is an image-recording method according to the third aspect, further comprising the step of storing data relating to relationship between the one of the temperature of the recording head or the temperature of the location which is presumed to be associated with the temperature of the recording head, and the separation between the transmission component and the condensing lens, wherein the separation between the transmission component and the condensing lens is adjusted on the basis of the measured temperature and the stored data.

A ninth aspect of the present invention is an image-recording method according to the third aspect further comprising the step of storing data relating to relationship among the one of the temperature of the recording head or the temperature of the location which is presumed to be associated with the temperature of the recording head, the separation between the transmission component and the condensing lens, and an amount of divergence of the light beam from the transmission component, wherein the separation between the transmission component and the condensing lens is adjusted on the basis of the measured temperature and the stored data.

A tenth aspect of the present invention is an image-recording method according to the third aspect further comprising the step of storing data relating to relationship between the one of the temperature of the recording head or the temperature of the location which is presumed to be associated with the temperature of the recording head, and the separation between the printing plate and the condensing lens, wherein the separation between the printing plate and the condensing lens is adjusted on the basis of the temperature and the stored data.

An eleventh aspect of the present invention is an image-recording method according to the third aspect further comprising the step of storing data relating to relationship among the one of the temperature of the recording head or the temperature of the location which is presumed to be associated with the temperature of the recording head, the separation between the printing plate and the condensing lens, and a focus distance of the light beam from the condensing lens, wherein the separation between the printing plate and the condensing lens is adjusted on the basis of the temperature and the stored data.

DESCRIPTION OF THE PREFERRED EMBODIMENTS

Figure 1:
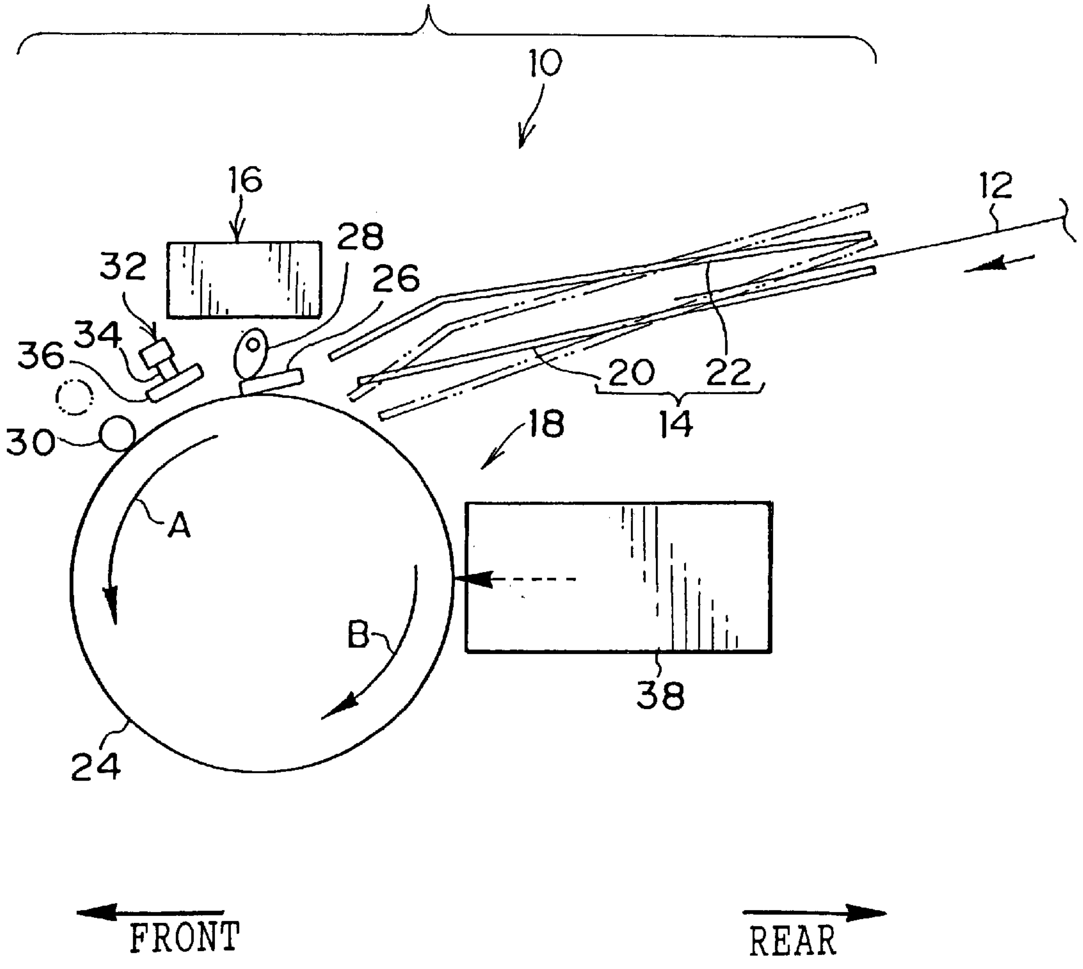
FIG. 1 is a schematic side view showing a printing plate automatic exposure device relating to an embodiment of the present invention.

FIG. 1 shows a side view of a printing plate automatic exposure device 10 relating to the present embodiment, which is structured with application of the image-recording device of the present invention.

The printing plate automatic exposure device 10 relating to the present embodiment is for so-called CTP (computer-to-plate) printing exposure device, and is a device which exposes (records) an image at an image-forming layer (a photosensitive layer/emulsion surface) on a support of a printing plate 12, which is a photopolymer plate, a thermal plate or the like. The printing plate automatic exposure device 10 is divided into a conveyance guide unit 14, a punching section 16 and an exposure section 18. The punching section 16 and the exposure section 18 are disposed at a front side of the conveyance guide unit 14, and the exposure section 18 is disposed at a lower side of the punching section 16.

The conveyance guide unit 14 includes a feed guide 20 with a substantially square flat plate form and a discharge guide 22 with a substantially square flat plate form. A relative positional relationship between the feed guide 20 and the discharge guide 22 is set so as to form a laterally inclined V-shape. The conveyance guide unit 14 is structured to rotate by a predetermined angle around a central vicinity of FIG. 1. The feed guide 20 and the discharge guide 22 can be selectively made to correspond to the punching section 16 or the exposure section 18 by this rotation. The printing plate 12 is fed to and loaded on the feed guide 20.

The conveyance guide unit 14 is rotated and the feed guide 20 corresponds with (faces) the punching section 16. Hence, a front end portion of the printing plate 12 on the feed guide 20 is conveyed into the punching section 16, and a predetermined number of punch holes (not shown) such as, for example, a round hole and a long hole, are formed in the front end portion of the printing plate 12 by the punching section 16. When processing at the punching section 16 has finished, the printing plate 12 is returned onto the feed guide 20.

The exposure section 18 is equipped with a cylindrical rotary drum 24. The rotary drum 24 is disposed to be parallel in a left-right direction, and rotatable in the directions of arrow A and arrow B shown in FIG. 1. When the printing plate 12 has returned onto the feed guide 20 from the punching section 16 as described above, the conveyance guide unit 14 rotates and the feed guide 20 corresponds with the exposure section 18 (faces in a tangential direction of the rotary drum 24). Hence, the front end of the printing plate 12 is conveyed onto an outer periphery of the rotary drum 24, and the printing plate 12 is positioned.

A plate-like front end chuck 26 is disposed at a position to which the front end of the printing plate 12 is conveyed on the outer periphery of the rotary drum 24. A substantially central portion in a front-rear direction of the front end chuck 26 is supported such that the front end chuck 26 is freely rotatable at the rotary drum 24, and is subjected to elastic force in a direction of separation of a front side of the front end chuck 26 from the outer periphery of the rotary drum 24.

A mounting cam 28 is provided at an upper side of the front end chuck 26. The mounting cam 28 applies pressure to the front side of the front end chuck 26, and thus a rear side of the front end chuck 26 is separated from the outer periphery of the rotary drum 24. In accordance therewith, the printing plate 12 that has been conveyed onto the outer periphery of the rotary drum 24 from the feed guide 20, as described above, is inserted between the rear side of the front end chuck 26 and the outer periphery of the rotary drum 24. In this state, positioning of the printing plate 12 is carried out. After the positioning of the printing plate 12 has been completed, the mounting cam 28 rotates and releases the pressure on the front side of the front end chuck 26. As a result, the rear side of the front end chuck 26 is pressed against the front end of the printing plate 12 by the elastic force. Thus, the front end of the printing plate 12 is held to the outer periphery of the rotary drum 24. When the front end of the printing plate 12 is thus held at the outer periphery of the rotary drum 24, the rotary drum 24 is rotated in the direction of arrow A in FIG. 1, and the printing plate 12 is wound onto the outer periphery of the rotary drum 24.

A squeeze roller 30 is disposed in a vicinity of the outer periphery of the rotary drum 24, at a side of the mounting cam 28 in the direction of arrow A in FIG. 1. The squeeze roller 30 is moved to the rotary drum 24 side thereof, and presses the printing plate 12 that is being wound onto the rotary drum 24 toward the rotary drum 24, while rotating therewith. Thus, the printing plate 12 is closely adhered to the outer periphery of the rotary drum 24.

A rear end chuck attachment/detachment unit 32 is disposed at the vicinity of the outer periphery of the rotary drum 24, between the mounting cam 28 and the squeeze roller 30. The rear end chuck attachment/detachment unit 32 includes a shaft 34. The shaft 34 is moveable toward the rotary drum 24. A rear end chuck 36 is mounted at a distal end of the shaft 34. When a rear end of the printing plate 12 that is being wound onto the rotary drum 24 opposes the rear end chuck attachment/detachment unit 32, the shaft 34 moves the rear end chuck 36 to the rotary drum 24 side thereof, and attaches the rear end chuck 36 at a predetermined position of the rotary drum 24. At this time, the rear end chuck 36 is separated from the shaft 34. Consequently, the rear end chuck 36 presses against the rear end of the printing plate 12, and the rear end of the printing plate 12 is held to the outer periphery of the rotary drum 24.

Accordingly, when the front end and the rear end of the printing plate 12 have been held to the rotary drum 24 by the front end chuck 26 and the rear end chuck 36, the squeeze roller 30 is separated from the rotary drum 24, and the rotary drum 24 is rapidly rotated at a predetermined rotation speed thereafter.

Figure 2:
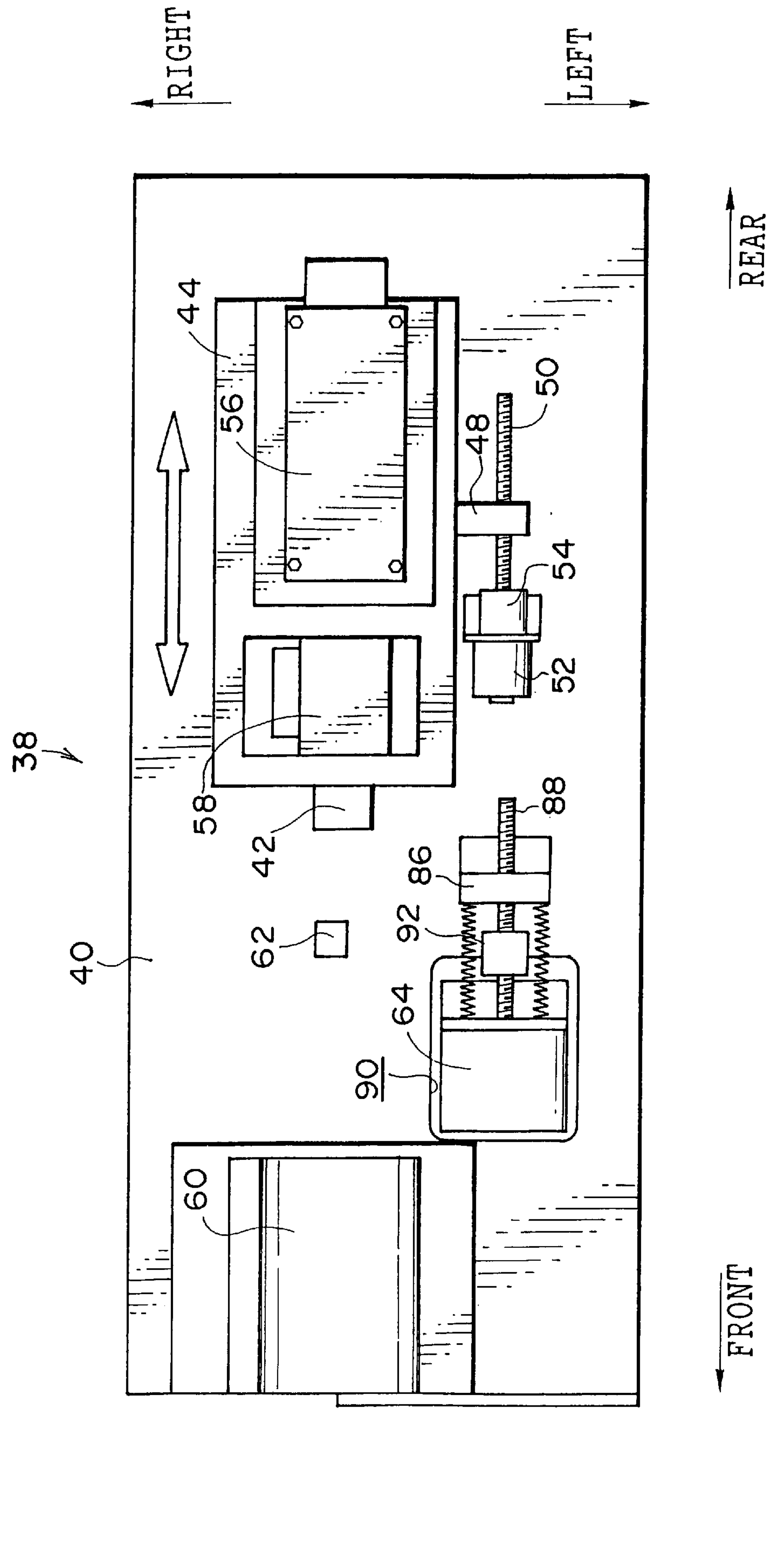
FIG. 2 is a plan view showing a recording head relating to the embodiment of the present invention.
Figure 3:
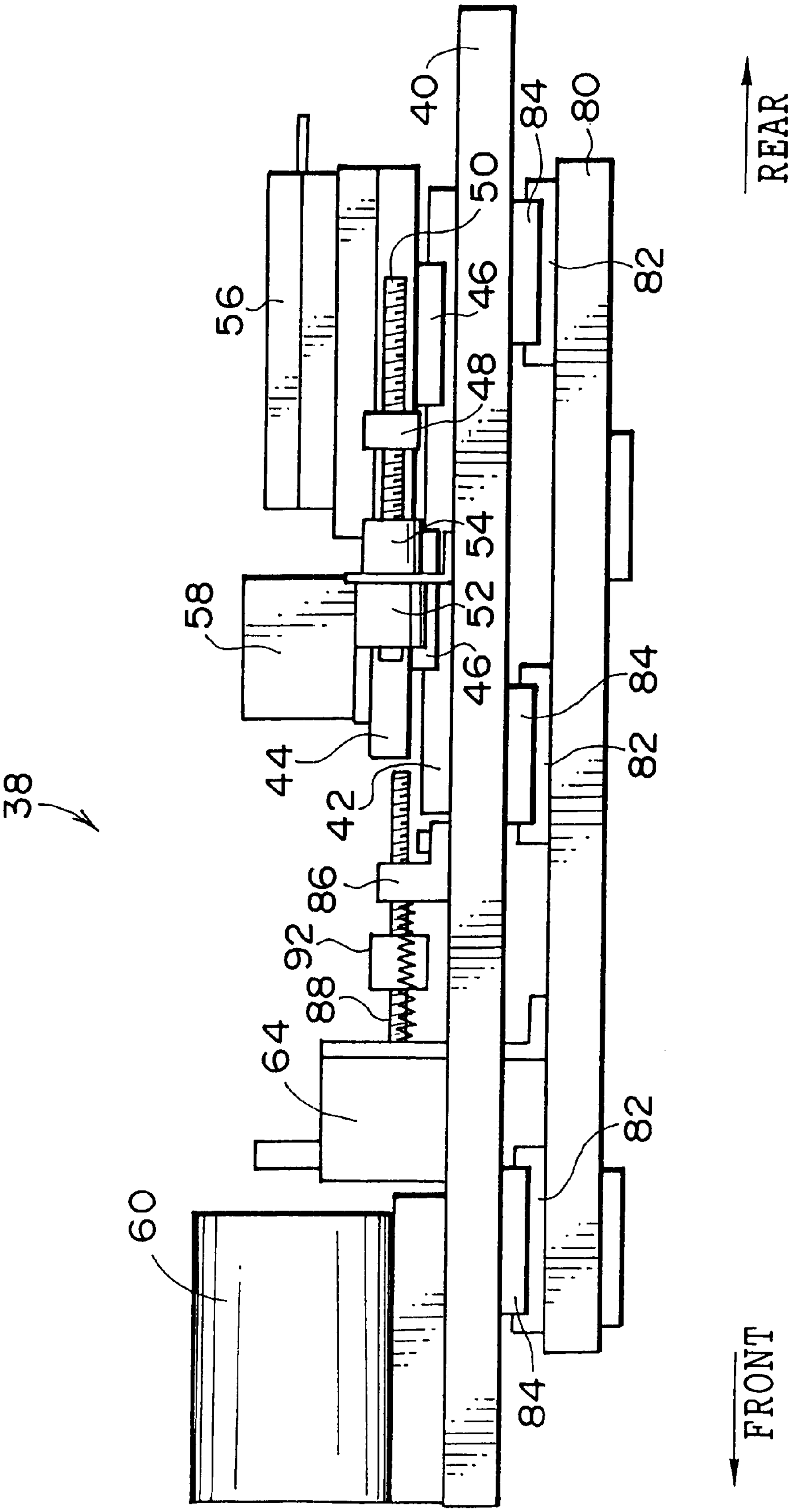
FIG. 3 is a side view showing a recording head relating to the embodiment of the present invention.

A recording head (exposure head) 38 is disposed at a rear side vicinity of the outer periphery of the rotary drum 24. The recording head 38 is moveable along an axial direction (the left-right direction) of the rotary drum 24. As shown in FIGS. 2 and 3, the recording head 38 is provided with a support platform 80. A predetermined number of support rails 82 are fixed on the support platform 80 along the front-rear direction. An equipment platform 40 is disposed above the predetermined number of support rails 82. A predetermined number of support guides 84 are fixed at a lower face of the equipment platform 40. The support guides 84 fit onto the respective support rails 82, and the support guides 84 slide relative to the support rails 82. Thus, the equipment platform 40 is slideable in the front-rear direction.

A female screw plate 86, which structures a focus adjustment component, is fixed on the equipment platform 40 at a substantially central portion in the front-rear direction of the equipment platform 40, at a position which is offset leftward from a collimator lens 58 and a condensing lens 60. An internal female thread (not shown) is formed along the front-rear direction in the female screw plate 86. A male screw 88, which also structures the focus adjustment component, is screwed into this internal thread. The male screw 88 serves as a driveshaft of a pulse motor 64 (focus adjustment correction device), which also structures the focus adjustment component. The pulse motor 64 passes through a through-hole 90, which is formed in a front side region of the equipment platform 40, and is fixed on the support platform 80. When the male screw 88 is driven by the pulse motor 64 and rotated, the female screw plate 86 moves in the front-rear direction, and the equipment platform 40 slides in the front-rear direction. The pulse motor 64 is connected to a control device (not shown). A round column-shaped rotation cylinder 92 is fixed to the male screw 88. When the rotation cylinder 92 is rotated manually and thus the male screw 88 is rotated, the female screw plate 86 is moved in the front-rear direction, and the equipment platform 40 can be slid in the front-rear direction.

A rail 42 along the front-rear direction is fixed on the equipment platform 40 at a rear end position of the equipment platform 40. A moving stage 44 is disposed above the rail 42. A predetermined number (two in the present embodiment) of sliding guides 46 are fixed at a lower face of the moving stage 44. The respective sliding guides 46 fit onto the rail 42, and the respective sliding guides 46 slide relative to the rail 42. Thus, the moving stage 44 is slideable in the front-rear direction.

A female screw plate 48, which structures an adjustment component, is fixed to a left side wall of the moving stage 44. An internal thread (not shown) is formed along the front-rear direction in the female screw plate 48. A male screw 50, which also structures the adjustment component, is screwed into this internal thread. The male screw 50 serves as a driveshaft of a pulse motor 52, which also structures the adjustment component. The pulse motor 52 is fixed on the equipment platform 40. When the male screw 50 is driven by the pulse motor 52 and rotated, the female screw plate 48 moves in the front-rear direction, and the moving stage 44 slides in the front-rear direction. The pulse motor 52 is connected to the aforementioned control device. A round column-shaped rotation cylinder 54 is fixed to the male screw 50. When the rotation cylinder 54 is rotated manually and thus the male screw 50 is rotated, the female screw plate 48 is moved in the front-rear direction, and the moving stage 44 can be slid in the front-rear direction.

A fiber array light source 56 is fixed on the moving stage 44 at a rear side region thereof. The fiber array light source 56 transmits a light beam, which is modulated on the basis of image data that has been read in, forward. The collimator lens 58, which serves as a transmission component, is disposed on the moving stage 44 at a front side region thereof. The collimator lens 58 transmits the incident light beam from the fiber array light source 56 forward as predetermined parallel light or divergent light.

The condensing lens 60 is fixed on the equipment platform 40 at a front end portion thereof. The condensing lens 60 is disposed frontward of the collimator lens 58. When the light beam transmitted from the collimator lens 58 is incident at the condensing lens 60, the condensing lens 60 focuses the light beam and transmits the light beam forward. Thus, a high-power light beam (laser beam) is irradiated from the condensing lens 60 of the recording head 38 toward the rotary drum 24, which is rotating at high-speed as mentioned above, contemporaneously with the rotation of the rotary drum 24. Thus, the printing plate 12 is exposed on the basis of the image data (i.e., an image is recorded (drawn) on the printing plate 12). This exposure processing, of rotating the rotary drum 24 at high speed (mainscanning) while moving the recording head 38 in the axial direction of the rotary drum 24 (sub-scanning) is known as "scanning exposure".

A temperature sensor 62, which serves as a measuring component, is disposed on the equipment platform 40, between the condensing lens 60 and the moving stage 44 (the collimator lens 58). The temperature sensor 62 measures, for example, the temperature of the equipment platform 40 between the condensing lens 60 and the collimator lens 58 (i.e., the recording head 38) before exposure processing of the printing plate 12. The temperature sensor 62 is connected to the aforementioned control device. When the temperature sensor 62 measures the temperature of the equipment platform 40, a required sliding amount (including a sliding direction) of the moving stage 44 is obtained from data which has been preparatorily stored as a table at the control device (this data concerns a relationship between temperature of the location at which the temperature sensor 62 is disposed and a separation between the condensing lens 60 and the collimator lens 58). The pulse motor 52 is driven on the basis of this sliding amount and direction, and slides the moving stage 44. Thus, with this structure, the separation between the condensing lens 60 and the collimator lens 58 is always kept constant.

Further, when the temperature sensor 62 measures the temperature of the equipment platform 40, a required sliding amount (including a sliding direction) of the moving stage 44 is obtained from data which has been preparatorily stored as a table at the control device (this data concerns a relationship between temperature of the location at which the temperature sensor 62 is disposed and an amount of divergence of the light beam from the collimator lens 58). The pulse motor 52 is driven on the basis of this sliding amount and direction, and slides the moving stage 44. Thus, with this structure, the separation between the condensing lens 60 and the collimator lens 58 is adjusted, and undesired variation of the amount of divergence of the light beam that is incident on the condensing lens 60 from the collimator lens 58 is eliminated.

Further again, when the temperature sensor 62 measures the temperature of the equipment platform 40, a required sliding amount (including a sliding direction) of the equipment platform 40 is obtained from data which has been preparatorily stored as a table at the control device (this data concerns a relationship between temperature of the location at which the temperature sensor 62 is disposed and a separation between the printing plate 12 that is wound onto the rotary drum 24 and the condensing lens 60). The pulse motor 64 is driven on the basis of this sliding amount and direction, and slides the equipment platform 40. Thus, with this structure, the separation between the printing plate 12 wound onto the rotary drum 24 and the condensing lens 60 is always kept constant.

Yet further, when the temperature sensor 62 measures the temperature of the equipment platform 40, a required sliding amount (including a sliding direction) of the equipment platform 40 is obtained from data which has been preparatorily stored as a table at the control device (this data concerns a relationship between temperature of the location at which the temperature sensor 62 is disposed and a focusing distance of the light beam from the condensing lens 60). The pulse motor 64 is driven on the basis of this sliding amount and direction, and slides the equipment platform 40. Thus, with this structure, the separation between the printing plate 12 wound onto the rotary drum 24 and the condensing lens 60 is adjusted, and undesired variation of the focusing distance of the light beam from the condensing lens 60 is eliminated.

When the scanning exposure onto the printing plate 12 has been completed, the rotary drum 24 is temporarily halted at a position such that the rear end chuck 36 opposes the shaft 34. The rear end chuck 36 is taken off from the rotary drum 24 by the shaft 34 (i.e., the rear end chuck 36 is mounted to the shaft 34), and pressure by the rear end chuck 36 on the rear end of the printing plate 12 is released. In addition, the conveyance guide unit 14 rotates and the discharge guide 22 corresponds with the exposure section 18 (faces in a tangential direction of the rotary drum 24). Then, the rotary drum 24 is rotated in the direction of arrow B in FIG. 1, and thus the printing plate 12 is conveyed rearward, from the rear end side thereof, and discharged to the discharge guide 22. In accordance therewith, the mounting cam 28 is rotated, and applies pressure to the front end of the front end chuck 26. Consequently, the pressure on the front end of the printing plate 12 from the rear end of the front end chuck 26 is released. Further, when the printing plate 12 has been transferred to the discharge guide 22, the conveyance guide unit 14 rotates, and the printing plate 12 is ejected from the discharge guide 22.

Next, operation of the present embodiment will be described.

In the printing plate automatic exposure device 10 having the structure described above, when the printing plate 12 is loaded at the feed guide 20, firstly, the conveyance guide unit 14 is rotated and the feed guide 20 is corresponded with the punching section 16. Hence, the front end portion of the printing plate 12 is conveyed into the punching section 16. The predetermined number of punch holes are formed in the front end portion of the printing plate 12 that has been conveyed into the punching section 16, and then the printing plate 12 is returned to the feed guide 20.

Then, the conveyance guide unit 14 is rotated and the feed guide 20 is corresponded with the exposure section 18. Hence, the printing plate 12 is conveyed to the exposure section 18 and positioned. The front end and rear end of the printing plate 12 that has been positioned are held to the outer periphery of the rotary drum 24 by the front end chuck 26 and the rear end chuck 36, respectively. The printing plate 12 is closely adhered to the outer periphery of the rotary drum 24 by the squeeze roller 30 while the printing plate 12 is being wound onto the outer periphery of the rotary drum 24. When the printing plate 12 has been wound onto the outer periphery of the rotary drum 24, the rotary drum 24 is rotated at high speed, and in this state the recording head 38 irradiates a light beam from the fiber array light source 56, through the collimator lens 58 and the condensing lens 60. Thus, exposure processing is carried out.

When the exposure processing has been completed, the conveyance guide unit 14 is rotated and the discharge guide 22 is corresponded with the rotary drum 24. Holding of the printing plate 12 to the outer periphery of the rotary drum 24 by the front end chuck 26 and the rear end chuck 36 is released, and the printing plate 12 is discharged from the rotary drum 24 to the discharge guide 22. Thereafter, the conveyance guide unit 14 is rotated and the printing plate 12 is ejected from the discharge guide 22.

In this operation, the temperature sensor 62 disposed at the recording head 38 measures the temperature of the recording head 38 (i.e., the temperature of the equipment platform 40 between the condensing lens 60 and the moving stage 44). The pulse motor 52 is driven on the basis of the measured temperature of the recording head 38, and thus the separation between the collimator lens 58 and the condensing lens 60 is adjusted. As a result, the separation between the collimator lens 58 and the condensing lens 60 can be kept constant, regardless of contraction or expansion of the recording head 38 due to temperature variations of the recording head 38. In addition, even if the temperature of the collimator lens 58 changes due to a change in temperature of the recording head 38, such that the collimator lens 58 expands or contracts and thus the amount of divergence of the light beam from the collimator lens 58 is altered, the pulse motor 52 can adjust the separation between the collimator lens 58 and the condensing lens 60, and this alteration of the amount of divergence of the light beam incident on the condensing lens 60 from the collimator lens 58 can be eliminated.

Accordingly, even when the light beam incident on the condensing lens 60 from the collimator lens 58 is divergent, shifts in the magnification of the image to be recorded can be prevented regardless of temperature variations of the recording head 38 (without controlling the temperature of the recording head 38 (the collimator lens 58)).

Moreover, when the temperature sensor 62 measures the temperature of the recording head 38, the pulse motor 64 is driven on the basis of the measured temperature of the recording head 38, and thus the separation between the condensing lens 60 and the printing plate 12 wound onto the rotary drum 24 is adjusted. As a result, even if, when the recording head 38 expands or contracts due to temperature variations of the recording head 38, such that the separation between the recording head 38 and the printing plate 12 changes and hence the separation between the condensing lens 60 and the printing plate 12 changes, the separation between the condensing lens 60 and the printing plate 12 can be kept constant by driving the pulse motor 64. In addition, even if the temperature of the condensing lens 60 changes due to a change in temperature of the recording head 38, such that the condensing lens 60 expands or contracts and thus the focusing distance of the light beam from the condensing lens 60 is altered, the separation between the condensing lens 60 and the printing plate 12 is adjusted by driving the pulse motor 64, and this alteration of the focusing distance of the light beam from the condensing lens 60 can be eliminated.

Accordingly, even when the temperature of the recording head 38 changes, a shift of focus (zoom) of the image to be recorded can be prevented without controlling the temperature of the recording head 38 (the condensing lens 60).

Furthermore, (a portion of) the equipment platform 40 between the condensing lens 60 and the moving stage 44 is a location that highly effects the separation between the condensing lens 60 and the collimator lens 58, the separation between the condensing lens 60 and the printing plate 12 wound onto the rotary drum 24, and the temperatures of the collimator lens 58 and the condensing lens 60 when temperature thereof changing. Accordingly, because the temperature sensor 62 measures the temperature of the equipment platform 40 between the condensing lens 60 and the moving stage 44, variations (change) in the separation between the collimator lens 58 and the condensing lens 60, variations in the separation between the condensing lens 60 and the printing plate 12, and variations in the temperatures of the collimator lens 58 and the condensing lens 60 can be favorably detected. Therefore, the separation between the collimator lens 58 and the condensing lens 60 and the separation between the condensing lens 60 and the printing plate 12 wound onto the rotary drum 24 can be favorably adjusted.

Because the separation between the collimator lens 58 and the condensing lens 60 can be adjusted by the pulse motor 52, a requirement for consideration of accuracy of the separation between the collimator lens 58 and the condensing lens 60 in the front-rear direction (the direction of irradiation of the beam) when the collimator lens 58 (the moving stage 44) and the condensing lens 60 are assembled can be relaxed.

Further, because the separation between the condensing lens 60 and the rotary drum 24 can be adjusted by the pulse motor 64, a requirement for consideration of accuracy of the separation between the condensing lens 60 and the rotary drum 24 in the front-rear direction (the direction of irradiation of the beam) when the condensing lens 60 and the rotary drum 24 are assembled can be relaxed.

Figure 4:
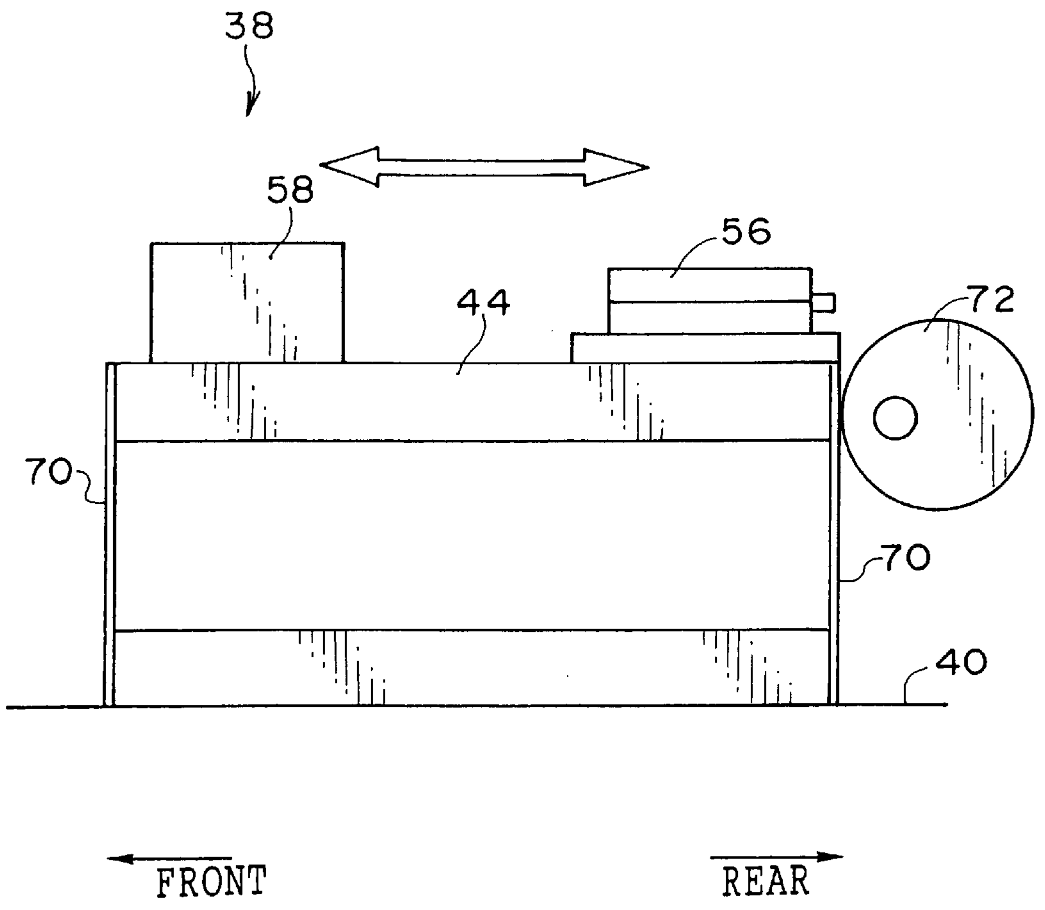
FIG. 4 is a side view showing principal elements of a variant example of the recording head relating to the embodiment of the present invention.

In the structure of the present embodiment, the moving stage 44 is slid by driving of the pulse motor 52, and thus the separation between the collimator lens 58 and the condensing lens 60 is adjusted. The structure shown in FIG. 4 is also acceptable. Specifically, in the structure shown in FIG. 4, a pair of leaf springs 70, which are resilient, are standingly provided. The pair of leaf springs 70 face one another in the front-rear direction. The moving stage 44 bridges across between upper portions of the pair of leaf springs 70. Thus, the moving stage 44 can be moved in the front-rear direction by resilient deformation of the pair of leaf springs 70. A cam 72, which is an eccentric cam or the like structuring the adjustment component, is provided rearward of the pair of leaf springs 70. The cam 72 is connected to a driving motor (not shown), which also structures the adjustment component, and the cam 72 is driven to rotate by the driving motor. This driving motor is connected to the aforementioned control device.

In this structure, the driving motor is driven on the basis of the temperature of the recording head 38 measured by the temperature sensor 62. Thus, the cam 72 is rotated and the pair of leaf springs 70 is resiliently deformed. Consequently, the moving stage 44 is moved in the front-rear direction, and the separation between the collimator lens 58 and the condensing lens 60 is adjusted.

Furthermore, in the structure of the present embodiment, the equipment platform 40 is slid by driving of the pulse motor 64, and thus the separation between the condensing lens 60 and the rotary drum 24 (the printing plate 12) is adjusted. However, the structure shown in FIG. 4 is also acceptable. Specifically, the equipment platform 40 bridges across between a pair of resilient leaf springs which are standingly provided on the support platform 80. A cam, which is an eccentric cam or the like structuring the focus adjustment component, is rotated on the basis of the temperature of the recording head 38, as measured by the temperature sensor 62, and resiliently deforms the pair of leaf springs. Thus, the equipment platform 40 is moved in the front-rear direction, and the separation between the condensing lens 60 and the rotary drum 24 is adjusted.

Figure 5:
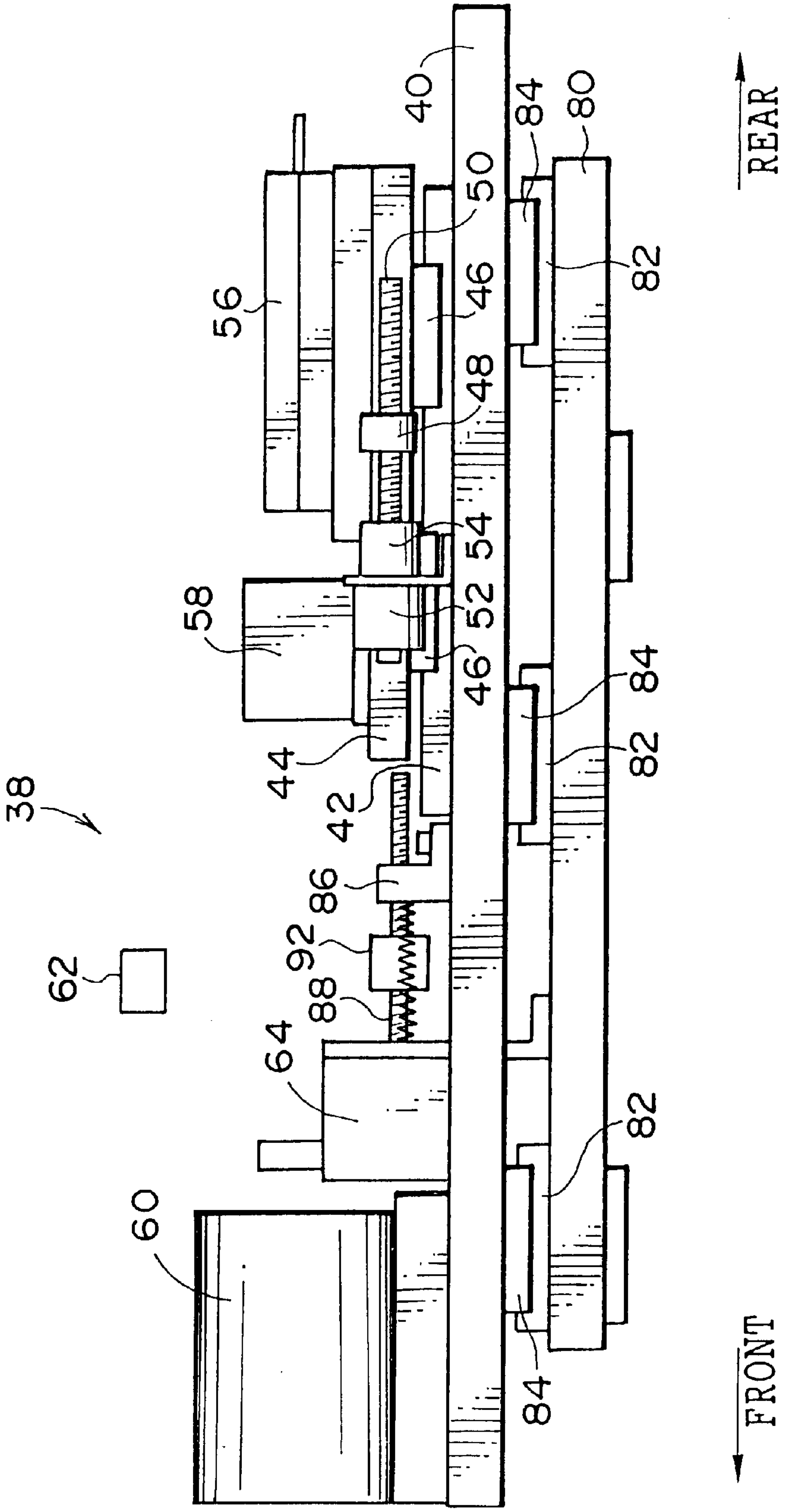
FIG. 5 is a side view showing a variant example of a location, at the recording head relating to the embodiment of the present invention, at which a temperature sensor is disposed.

Further again, in the structure of the present embodiment, the temperature sensor 62 is disposed at the recording head 38, and measures the temperature of the recording head 38 (the temperature of the equipment platform 40 between the condensing lens 60 and the moving stage 44). However, a temperature sensor (measuring component) may be disposed at a location which is presumed to be associated with the temperature of the recording head, so as to measure the temperature of that location. (Temperature of that location corresponds to temperature of the recording head such that the temperature of the recording head can be estimated on the basis of the temperature of that location.) For example, as shown in FIG. 5, a structure in which the temperature sensor 62 is disposed in a vicinity above the equipment platform 40 between the condensing lens 60 and the moving stage 44, and the temperature sensor 62 measures the temperature of that position (the temperature of the atmosphere in the vicinity of the recording head 38) is also acceptable.

Further, the present invention is not limited to the same. It is also preferable that a plurality of temperature sensors are disposed at respective predetermined positions, and data concerns a relationship between temperatures of the respective positions and the separation between the condensing lens 60 and the collimator lens 58, the amount of divergence of the light beam from the collimator lens 58, the separation between the printing plate 12 that is wound onto the rotary drum 24 and the condensing lens 60, and the focusing distance of the light beam from the condensing lens 60, is preparatorily stored as a table at the control device. Then, the above described adjustment (control) is carried out on the basis of this data and the measured temperatures.

The present embodiment is structured for application of the present invention to CTP printing, but the present invention may be applied to other image-recording devices provided with zoom mechanisms.

In an image-recording device according to one aspect of the present invention, a measuring component measures the temperature of a recording head and/or the temperature of a location which is presumed to be associated with the temperature of the recording head. On the basis of the measured temperature, an adjustment component adjusts a separation between a transmission component and a focusing lens. As a result, the separation between the transmission component and the focusing lens can be kept constant by the adjustment component. In addition, the adjustment component can adjust the separation between the transmission component and the focusing lens so as to eliminate an error in an amount of divergence of a light beam that is incident on the focusing lens from the transmission component. Accordingly, even when the light beam incident on the focusing lens from the transmission component is divergent, an error in magnification of an image that is recorded can be prevented, regardless of temperature variations of the recording head.

In an image-recording device according to another aspect of the present invention, a measuring component measures the temperature of a recording head and/or the temperature of a location which is presumed to be associated with the temperature of the recording head. On the basis of the measured temperature, a focus adjustment component adjusts a separation between a focusing lens and a printing plate. As a result, the separation between the focusing lens and the printing plate can be kept constant by the focus adjustment component. In addition, the focus adjustment component can adjust the separation between the focusing lens and the printing plate so as to eliminate an error in a focusing distance of a light beam from the focusing lens. Accordingly, an error in focusing of an image that is recorded can be prevented, regardless of temperature variations of the recording head.

What is claimed is:

1. An image-recording device comprising:

a recording head which includes a transmission component which transmits a light beam, and a condensing lens at which the light beam transmitted from the transmission component is incident, the recording head recording an image at a printing plate by irradiating the light beam through the transmission component and the condensing lens to the printing plate;

a measuring component which measures one of a temperature of the recording head or a temperature of a location which is presumed to be associated with the temperature of the recording head; and an adjustment component which adjusts a separation between the transmission component and the condensing lens on the basis of the temperature measured by the measuring component.

2. An image-recording device comprising:

a recording head which includes a condensing lens, the recording head recording an image at a printing plate by irradiating a light beam from the condensing lens to the printing plate;

a measuring component which measures one of a temperature of the recording head or a temperature of a location which is presumed to be associated with the temperature of the recording head; and a focus adjustment component which adjusts a separation between the condensing lens and the printing plate on the basis of the temperature measured by the measuring component.

3. An image-recording method comprising the steps of:

measuring one of a temperature of a recording head which includes a transmission component which transmits a light beam, and a condensing lens at which the light beam transmitted from the transmission component is incident, the recording head recording an image at a printing plate by irradiating the light beam through the transmission component and the condensing lens to the printing plate, or a temperature a location in the vicinity of the recording head; and adjusting at least one of a separation between the transmission component and the condensing lens and a separation between the condensing lens and the printing pate on the basis of the measured temperature.

4. An image-recording device according to claim 1 further comprising:

a storing section for storing data relating to relationship between the one of the temperature of the recording head or the temperature of the location which is presumed to be associated with the temperature of the recording head, and the separation between the transmission component and the condensing lens, wherein the adjustment component adjusts the separation between the transmission component and the condensing lens on the basis of the temperature measured by the measuring component and the stored data.

5. An image-recording device according to claim 1 further comprising:

a storing section for storing data relating to relationship among the one of the temperature of the recording head or the temperature of the location which is presumed to be associated with the temperature of the recording head, the separation between the transmission component and the condensing lens, and an amount of divergence of the light beam from the transmission component, wherein the adjustment component adjusts the separation between the transmission component and the condensing lens on the basis of the temperature measured by the measuring component and the stored data.

6. An image-recording device according to claim 2 further comprising:

a storing section for storing data relating to relationship between the one of the temperature of the recording head or the temperature of the location which is presumed to be associated with the temperature of the recording head, and the separation between the printing plate and the condensing lens, wherein the focus adjustment component adjusts the separation between the printing plate and the condensing lens on the basis of the temperature measured by the measuring component and the stored data.

7. An image-recording device according to claim 2 further comprising:

a storing section for storing data relating to relationship among the one of the temperature of the recording head or the temperature of the location which is presumed to be associated with the temperature of the recording head, the separation between the printing plate and the condensing lens, and a focus distance of the light beam from the condensing lens, wherein the focus adjustment component adjusts the separation between the printing plate and the condensing lens on the basis of the temperature measured by the measuring component and the stored data.

8. An image-recording method according to claim 3, further comprising the step of storing data relating to relationship between the one of the temperature of the recording head or the temperature of the location which is presumed to be associated with the temperature of the recording head, and the separation between the transmission component and the condensing lens, wherein the separation between the transmission component and the condensing lens is adjusted on the basis of the measured temperature and the stored data.

9. An image-recording method according to claim 3 further comprising the step of storing data relating to relationship among the one of the temperature of the recording head or the temperature of the location which is presumed to be associated with the temperature of the recording head, the separation between the transmission component and the condensing lens, and an amount of divergence of the light beam from the transmission component, wherein the separation between the transmission component and the condensing lens is adjusted on the basis of the measured temperature and the stored data.

10. An image-recording method according to claim 3 further comprising the step of storing data relating to relationship between the one of the temperature of the recording head or the temperature of the location which is presumed to be associated with the temperature of the recording head, and the separation between the printing plate and the condensing lens, wherein the separation between the printing plate and the condensing lens is adjusted on the basis of the temperature and the stored data.

11. An image-recording method according to claim 3 further comprising the step of storing data relating to relationship among the one of the temperature of the recording head or the temperature of the location which is presumed to be associated with the temperature of the recording head, the separation between the printing plate and the condensing lens, and a focus distance of the light beam from the condensing lens, wherein the separation between the printing plate and the condensing lens is adjusted on the basis of the temperature and the stored data.

* * * * *